(12) United States Patent
Kim

(10) Patent No.: US 7,605,857 B2
(45) Date of Patent: Oct. 20, 2009

(54) METHODS OF MANUFACTURING MICROLENSES, MICROLENS ARRAYS AND IMAGE SENSORS

(75) Inventor: Sae-Young Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 749 days.

(21) Appl. No.: 11/334,923

(22) Filed: Jan. 19, 2006

(65) Prior Publication Data

US 2006/0170810 A1   Aug. 3, 2006

(30) Foreign Application Priority Data

Feb. 3, 2005   (KR) .................... 10-2005-0009822

(51) Int. Cl.
 *H04N 5/225* (2006.01)
(52) U.S. Cl. ...................... 348/335; 348/340
(58) Field of Classification Search ............... 348/335, 348/340
 See application file for complete search history.

(56) References Cited

U.S. PATENT DOCUMENTS

| | | | | |
|---|---|---|---|---|
| 5,422,285 A | * | 6/1995 | Ishibe | .................... 438/69 |
| 5,731,899 A | * | 3/1998 | Meyers | .................... 359/621 |
| 6,632,342 B1 | * | 10/2003 | Teshima et al. | ............. 205/118 |
| 6,821,810 B1 | * | 11/2004 | Hsiao et al. | .................... 438/69 |
| 7,488,618 B2 | * | 2/2009 | Wood et al. | .................... 438/72 |
| 2002/0008916 A1 | * | 1/2002 | Nishikawa et al. | .......... 359/619 |
| 2004/0082093 A1 | * | 4/2004 | Yamamoto | .................... 438/57 |
| 2005/0045975 A1 | * | 3/2005 | Kondo et al. | ................ 257/414 |
| 2006/0011932 A1 | * | 1/2006 | Kim | ............................ 257/98 |

FOREIGN PATENT DOCUMENTS

| | | |
|---|---|---|
| JP | 11-150254 | 6/1999 |
| JP | 11-340446 | 12/1999 |
| JP | 2004-140426 | 5/2004 |

OTHER PUBLICATIONS

Hwang-Cherng Chow et al., *New Pixel-Shared Design and Split-Path Readout of CMOS Image Sensor Circuits*, IEEE, pp. 49-52, 2002.

* cited by examiner

*Primary Examiner*—James M Hannett
(74) *Attorney, Agent, or Firm*—F. Chau & Associates, LLC

(57) ABSTRACT

A method of manufacturing a microlens is provided. The method includes forming a first lens pattern, forming a second lens pattern on a portion of the first lens pattern in a manner which controls an asymmetric curvature of the microlens. The method further includes reflowing the first and second lens patterns.

33 Claims, 18 Drawing Sheets

METHODS OF MANUFACTURING MICROLENSES, MICROLENS ARRAYS AND IMAGE SENSORS

CROSS-REFERENCE TO RELATED APPLICATION

This application claims the benefit of Korean Patent Application No. 2005-9822 filed on Feb. 3, 2005, the contents of which are incorporated by reference herein in its entirety.

BACKGROUND OF THE INVENTION

1. Field of the Invention

The present invention generally relates to image sensors and methods of manufacturing image sensors, and more particularly, to methods of manufacturing microlenses and microlens arrays used, for example, in image sensors, and a method of manufacturing image sensors including the same.

2. Description of the Related Art

Basically, an image sensor is a semiconductor device that converts an optical image into an electrical signal. Image sensors are widely used in the semiconductor industry and are typically classified as either charge-coupled device (CCD) image sensors or complementary metal-oxide semiconductor (CMOS) image sensors. The CMOS image sensor has several desirable attributes such as, for example, its ability to be mass produced through a wafer process, its low power consumption, its compatibility with peripheral circuits, and its applicability to single-chip technology. Due to the above-mentioned desirable characteristics of CMOS image sensors, CMOS image sensors are widely used in digital cameras, smart phones, personal digital assistants (PDAs), notebooks, security cameras, barcode detectors, high-definition television (HDTV) cameras and toys.

The image sensor is mainly comprised of a light-detector (typically, including a photodiode) for detecting light and also a logic circuit for processing the detected light and converting it into an electrical signal. Moreover, to increase the image sensor sensitivity to light, the fill factor (i.e. a ratio of a light-detecting area to a pixel area) of the image sensor should be high. However, the fill factor of an image sensor is limited by certain factors such as chip size, number of the pixels and the difficulty in removing the logic circuit section completely.

Accordingly, a concentrating technology, which changes the path of light that is incident upon the outside of the photodiode and which also condenses the light into the photodiode, has been developed. With the above technology, microlenses are used to concentrate the light. In addition, each microlens is assigned to a respective pixel and is typically made of a plano-convex lens having a constant curvature.

FIG. 1 is a cross-sectional diagram illustrating a conventional piano-convex lens having a constant curvature.

Referring to FIG. 1, a curved surface of the piano-convex lens is a portion of a circle, which is centered on an origin P.

In the above conventional method, a microlens of an image sensor is formed so that the center of the microlens is positioned over the center of a photodiode. However, there are difficulties encountered with the above conventional image sensor, in that because light through module lens (not shown) is incident perpendicularly to a light-receiving plane at the center of the microlens array and is concentrated on the center of the microlens array, a photodiode far from the center receives a relatively smaller quantity of the incident light than a photodiode at the center of the microlens array. Consequently a phenomenon known as shading occurs, in which outskirts of an image captured by the image sensor look darker.

FIG. 2 is a cross-sectional diagram illustrating the above-mentioned shading phenomenon.

Referring to FIG. 2, each of microlenses 220L, 220C and 220R is placed over respective photo detectors 210L, 210C and 210R. As shown in FIG. 2, the light through the module lens (not shown) is incident upon the microlens 220C at the center of the microlens array from a direction perpendicular to the light-receiving plane, while incident on the microlenses 220L and 220R at the outskirts of the microlens array from a direction tilted from the right angle. Thus, with photo detectors 210L and 210R which are located far from the center of the microlens array, the incident light is not concentrated on the center of the photo detector, but rather on a margin of the photo detector, thereby resulting in a decrease in the light-receiving efficiency of the image sensor. In addition, because the incident light through the module lens is concentrated on the center of the microlens array, the photo detectors 210L and 210R far from the center of the microlens array receive a relatively small quantity of incident light.

Thus, a conventional method for diminishing the above-mentioned shading phenomenon has been developed. This conventional method utilizes a method of moving the position of the microlens far from the center of the microlens array to the center of the microlens array. By moving the position of the microlens far from the center of the microlens array to the center of the microlens array, the incident light may be concentrated on the center of the photo detector far from the center of the microlens array, thereby enhancing the light-receiving efficiency of the image sensor. This conventional method, however, is difficult to apply to certain types of image sensors such as those for example, with a shared-pixel configuration, because the position of the microlens in these image sensors is difficult to shift properly.

In Japanese Patent Laid-Open Publication Number 1999-340446, entitled "Solid Imaging Device and Method of Manufacturing the Same," a solid imaging device is described, which attempts to enhance the light-receiving rate of the imaging device by causing the formation of an asymmetric curvature of a microlens far from the center of the microlens array, thereby concentrating the incident light on the center of a photo detector. Further, the method of manufacturing the solid imaging device of Japanese Patent Laid-Open Publication Number 1999-340446 described heating a microlens array, then rotating it and utilizing a centrifugal force so that the microlens of the microlens array might have a higher asymmetry of curvature in situations which the distance between the microlens of the microlens array and the center of the microlens array is greater. However, the method of manufacturing the solid imaging device of Japanese Patent Laid-Open Publication Number 1999-340446 is difficult to apply to a process for manufacturing a microlens array. In particular, with the process of manufacturing the microlens array described in Japanese Patent Laid-Open Publication Number 1999-340446, a wafer must be cut by a unit of a module lens, and a piece of the cut wafer must then be rotated, thereby resulting in increased manufacturing costs and time in producing the image sensor.

Therefore, an efficient method for manufacturing a microlens, which provides a microlens having an asymmetric curvature is needed.

SUMMARY OF THE INVENTION

Some exemplary embodiments of the present invention provide methods of effectively manufacturing a microlens having an asymmetric curvature.

Other exemplary embodiments of the present invention provide methods of manufacturing a microlens array, in which each microlens located farther from the center of the microlens array has a higher asymmetry of curvature than those microlens located nearer to the center of the microlens array.

Still other exemplary embodiments of the present invention provide methods of manufacturing an image sensor, which includes a microlens array in which each microlens located farther from the center of the microlens array has a higher asymmetry of curvature than those microlenses located nearer to the center of the microlens array.

In some exemplary embodiments of the present invention, methods of manufacturing a microlens having an asymmetric curvature are provided. A first lens pattern is formed and then a second lens pattern is formed on a portion of the first lens pattern in a manner which controls an asymmetric curvature of the microlens. The first and second lens patterns are reflowed to form the microlens having the asymmetric curvature. In addition, the method of manufacturing the microlens may further include forming a third lens pattern on the second lens pattern, wherein the third lens pattern is reflowed together with the first lens pattern and the second lens pattern after the third lens pattern is formed. The microlens manufactured by the method may be used for image sensors such as a CMOS image sensor or a charge-coupled device (CCD) image sensor. The asymmetric curvature of the microlens may be controlled based upon an area of the second lens pattern making contact with the first lens pattern, a position of the second lens pattern on the first lens pattern and/or a thickness of the second lens pattern.

In further exemplary embodiments, the first and second lens patterns may be heated at a gradually increasing temperature and then cooled. In addition, the first and second lens patterns may include a thermosetting acrylic resin having a light-transmittance which is no less than about 95%, and may be heated sequentially at about 140° C., about 150° C., about 160° C. and about 170° C. respectively for about 5 minutes, and then cooled.

In some exemplary embodiments of the present invention, a method of manufacturing a microlens array is provided. A first lens pattern array is formed and then a second lens pattern array is formed on the first lens pattern array in a manner which controls an asymmetric curvature of each microlens of the microlens array. The first and second lens pattern arrays are reflowed to form the microlens array having the asymmetric curvatures of the respective microlenses of the microlens array. Each microlens of the microlens array which is farther from the center of the microlens array has a higher asymmetry of curvature than those microlens of the microlens array which a r e located nearer to the center of the microlens array. The microlens array manufactured by the method may be used for a CMOS image sensor or a charge-coupled device (CCD) image sensor. The asymmetric curvature of the microlens of the microlens array may be controlled based on an area of a second lens pattern of the second lens pattern array making contact with a first lens pattern of the second lens pattern array, a position of a second lens pattern of the second lens pattern array on a first lens pattern of the first lens pattern array and/or a thickness of a second lens pattern of the second lens pattern array.

In further exemplary embodiments, the method of manufacturing the microlens array may further include forming a third lens pattern array on the second lens pattern array, and the third lens pattern array may be reflowed together with the first and second lens pattern arrays after the third lens pattern array is formed. In addition, the first and second lens pattern arrays may be heated at a gradually increasing temperature and then cooled. The first and second lens pattern arrays may include thermosetting acrylic resin having a light-transmittance which is no less than about 95%, and may be heated sequentially at about 140° C., about 150° C., about 160° C. and about 170° C. respectively for about 5 minutes, and then cooled.

In some exemplary embodiments of the present invention, a method of manufacturing an image sensor including a microlens array is provided. A photo detector array is formed on a semiconductor substrate. A first lens pattern array is formed over the photo detector, and a second lens pattern array is formed on the first lens pattern array to control an asymmetric curvature of each microlens of the microlens array. The first and the second lens pattern arrays are reflowed to form the microlens array having asymmetric curvatures of the respective microlenses of the microlens array. A curvature of a portion of a microlens may vary according to a distance between the portion of the microlens and a center of the microlens array, and the curvature of a far portion may be greater than the curvature of a near portion. Each microlens of the microlens array which is located farther from the center of the microlens array has a higher asymmetry of curvature than those microlens of the microlens array which are located nearer to the center of the microlens array. The manufacturing method may be used for manufacturing a CMOS image sensor or a charge-coupled device (CCD) image sensor. The asymmetric curvature of the microlens of the microlens array may be controlled based on an area of a second lens pattern of the second lens pattern array making contact with a first lens pattern of the second lens pattern array, a position of a second lens pattern of the second lens pattern array on a first lens pattern of the first lens pattern array, and/or a thickness of a second lens pattern of the second lens pattern array.

In additional exemplary embodiments, the method may further comprise forming a color filter between the photo detector array and the first lens pattern array. In addition, the method may further comprise forming a third lens pattern array on the second lens pattern array, wherein the third lens pattern array is reflowed together with the first and second lens pattern arrays after the third lens pattern array is formed. The first and second lens pattern arrays may be heated at a gradually increasing temperature and then cooled. The first and second lens pattern arrays may include thermosetting acrylic resin having a light-transmittance which is no less than about 95%, and may be heated sequentially at about 140° C., about 150° C., about 160° C. and about 170° C. respectively for about 5 minutes, and then cooled.

DESCRIPTION OF THE EXEMPLARY EMBODIMENTS OF THE INVENTION

Figure 1:
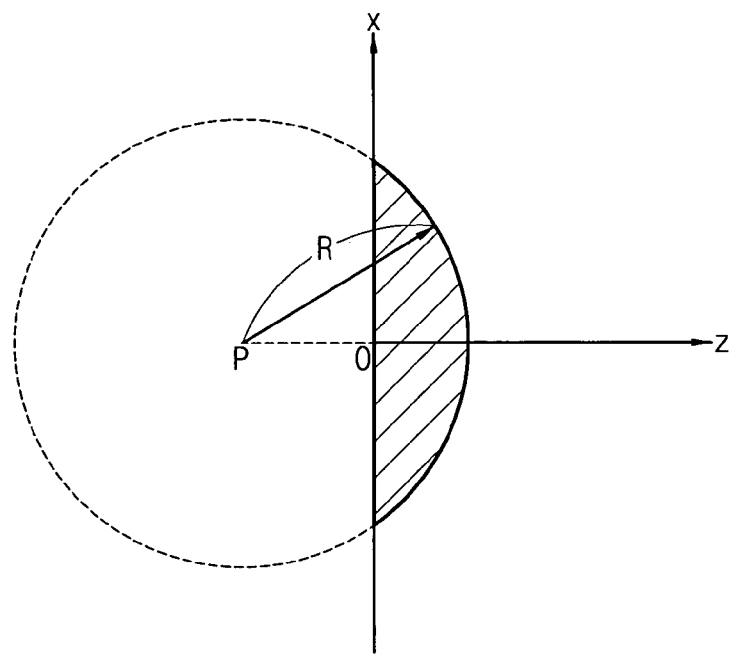
FIG. 1 is a cross-sectional diagram illustrating a plano-convex lens with a constant curvature.
Figure 2:
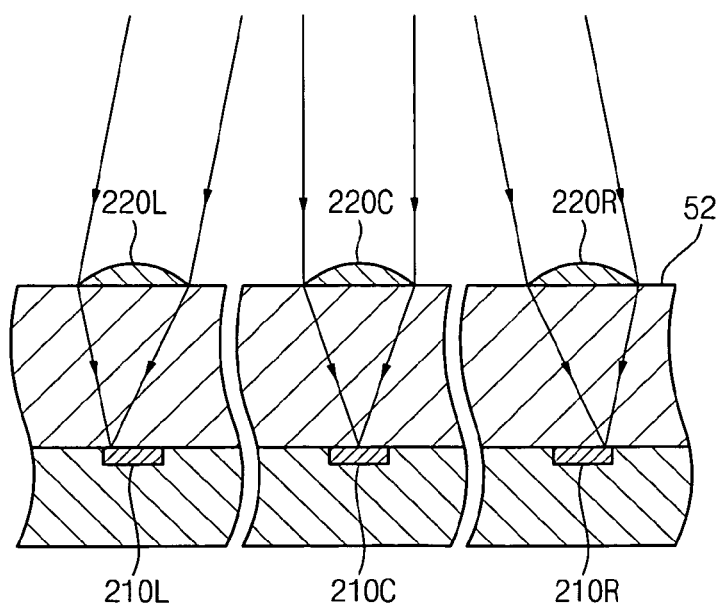
FIG. 2 is a cross-sectional diagram illustrating a shading phenomenon of a conventional image sensor.

Specific exemplary embodiments of the invention now will be described with reference to the accompanying drawings. This invention may, however, be embodied in many different forms and should not be construed as limited to the embodiments set forth herein. In the drawings, like numbers refer to like elements. It will be understood that when an element is referred to as being "connected" or "coupled" to another element, it can be directly connected or coupled to the other element or intervening elements may be present.

The terminology used herein is for the purpose of describing particular embodiments and is not intended to be limiting of the invention. As used herein, the singular forms "a", "an" and "the" are intended to include the plural forms as well, unless expressly stated otherwise. It will be further understood that the terms "includes," "includes," "including" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element. Thus, a first item could be termed a second item, and similarly, a second item may be termed a first item without departing from the teachings of the present invention. As used herein, the term "and/or" includes any and all combinations of one or more of the associated listed items. The symbol "/" may also used as a shorthand notation for "and/or".

In particular, an asymmetric curvature of a microlens includes a non-constant curvature and asymmetry of curvature corresponds to a difference between a great curvature of a portion of the microlens and a small curvature of another portion of the microlens.

Figure 3:
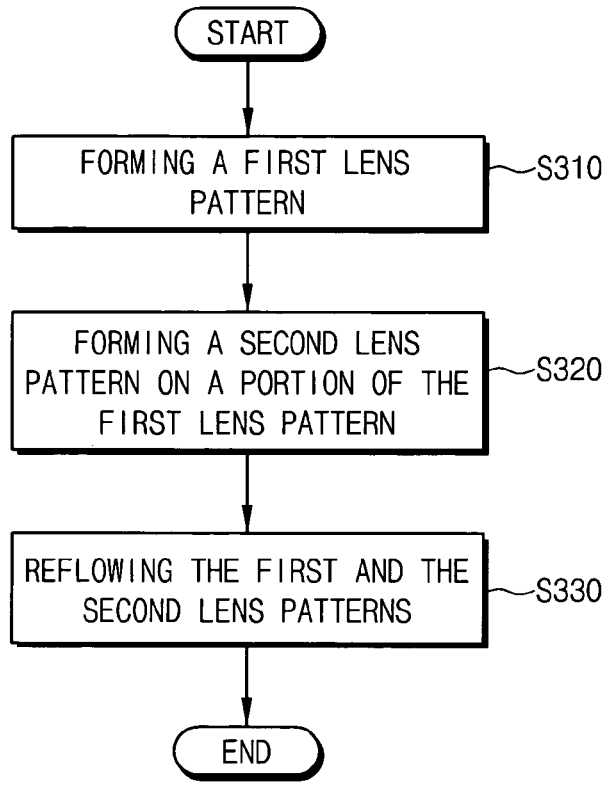
FIG. 3 is a flowchart illustrating a method for manufacturing an image sensor according to an exemplary embodiment of the present invention.

FIG. 3 is a flowchart illustrating a method for manufacturing an image sensor according to an exemplary embodiment of the present invention.

Referring to FIG. 3, in manufacturing an image sensor according to this exemplary embodiment, a first lens pattern is formed in step S310. The first lens pattern may be formed over a photo detector, wherein the photo detector includes devices, such as a photodiode, that receives light and converts the received light into an electric signal. A light-transmitting layer or a flattening layer may be formed between the first lens pattern and the photo detector.

The first lens pattern may be made of materials such as a thermosetting acrylic resin with a light-transmittance which is no less than about 95%. The first lens pattern may also be formed with photosensitive resins or thermoplastic materials.

The first lens pattern may be formed by an exposure and developing method. After forming a first lens layer, the exposure and developing procedure is executed to form the first lens pattern.

The first lens pattern may be formed by a photolithography method using a photoresist. According to the photolithography method, a first lens layer is formed, and a photoresist pattern is formed on the first lens layer so that a portion of the first lens layer is exposed. More particularly, a photoresist film is formed on the first lens layer, and then an exposure and developing process may be executed on the photoresist film, thereby forming the photoresist pattern on the first lens layer. The first lens pattern is formed by using the photoresist pattern as an etching mask to remove the exposed portion of the first lens layer.

In step S320, a second lens pattern is formed on the first lens pattern. The second lens pattern may comprise the same materials as the first lens pattern. For example, a thermosetting acrylic resin with a light-transmittance which is no less than about 95% may be used to form the second lens layer. The second lens pattern may also be formed with photosensitive resins or thermoplastic materials.

The second lens pattern may be formed by an exposure and developing method. After forming a second lens layer, the exposure and developing procedure is executed to form the second lens pattern.

The second lens pattern may be formed by a photolithography method using photoresist. According to a photolithography method, a second lens layer is formed, and a photoresist pattern is formed on the second lens layer so that a portion of the second lens layer is exposed. More particularly, a photoresist film is formed on the second lens layer, and then an exposure and developing process may be executed on the photoresist film, thereby forming the photoresist pattern on the second lens layer. The second lens pattern is formed by using the photoresist pattern as an etching mask to remove the exposed portion of the first lens layer.

For the purpose of forming an asymmetric curvature of a microlens, the second lens pattern is formed on the portion of the first lens pattern.

In step S330, the first lens pattern and the second lens pattern, which were formed so as to control an asymmetric curvature, are then reflowed.

In the step of reflowing, the first lens pattern and the second lens pattern may be heated at a gradually increasing temperature, and then may be cooled. For example, the first lens pattern and the second lens pattern may be heated sequentially at about 140° C. for about 5 minutes, at about 150° C. for about 5 minutes, at about 160° C. for about 5 minutes and at about 170° C. for about 5 minutes, and then may be cooled.

The first lens pattern and the second lens, which are softened in the step of reflowing, come to be in a shape of a piano-convex lens through the influence of surface tension and viscosity. However, as a result of forming the second lens pattern only on the portion of the first lens pattern, the portion at which the second lens pattern is formed gives rise to a greater curvature. Consequently, the microlens of the present exemplary embodiment has an asymmetric curvature unlike the conventional microlens shown in FIG. 1, which has a constant curvature.

Figure 4:
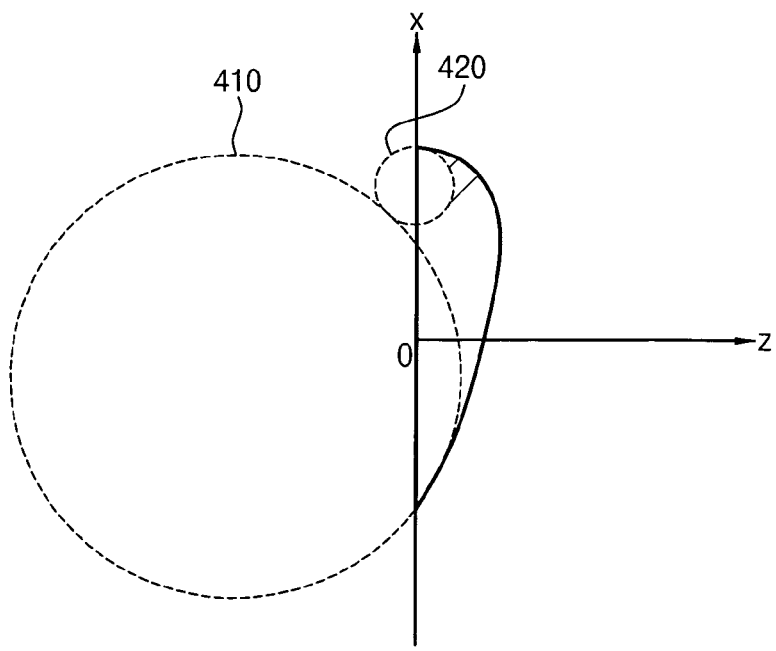
FIG. 4 is a cross-sectional diagram illustrating a microlens having an asymmetric curvature.

FIG. 4 is a cross-sectional diagram illustrating a microlens having an asymmetric curvature according to an exemplary embodiment of the present invention.

Referring to FIG. 4, unlike a piano-convex microlens having a constant curvature, the portion at which the second lens pattern is formed corresponds to a smaller radius of curvature, and the remaining portion corresponds to a greater radius of curvature.

Curvature refers to a differential coefficient representing the bending rate of a curve or a curved surface. When a point moves on a curve with a constant velocity, the direction of the moving point is changed according to the moving distance (i.e., a length of arc). In this instance, the differential coefficient of the moving direction, taken with respect to the moving direction, is called curvature. If the moving distance from point P to point Q along a curve on a plane is ΔS and an angle between two tangential lines at the point P and Q, then curvature k is defined as following Equation 1.

$$k = \lim_{\Delta s \to 0} \left| \frac{\Delta \theta}{\Delta s} \right|$$ [Equation 1]

Typically, a greater curvature corresponds to a smaller radius of curvature, and vice versa. A microlens with an asymmetric curvature is defined as "a microlens having a curved surface with a non-constant curvature" like the microlens shown in FIG. 4. Asymmetry of curvature refers to a difference between a great curvature of a portion of the microlens and small curvature of another portion of the microlens.

FIGS. 5 through 9 are cross-sectional diagrams illustrating operations for manufacturing an image sensor according to an exemplary embodiment of the present invention.

Figure 5:
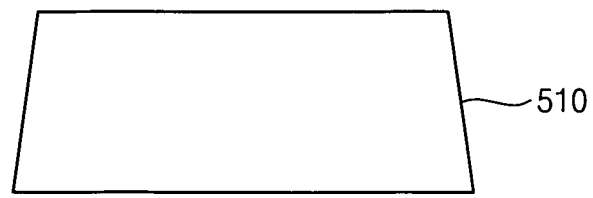
FIGS. 5 through 9 are cross-sectional diagrams illustrating operations for manufacturing an image sensor according to an exemplary embodiment of the present invention.

Referring to FIG. 5, a method of manufacturing an image sensor begins with forming a first lens pattern 510. The first lens pattern 510 may be formed with materials such as a thermosetting acrylic resin having a light-transmittance which is no less than about 95%. The first lens pattern 510 may also be formed with photosensitive resins or thermoplastic materials. As described above, the first lens pattern 510 may be formed by an exposure and developing method.

Figure 6:
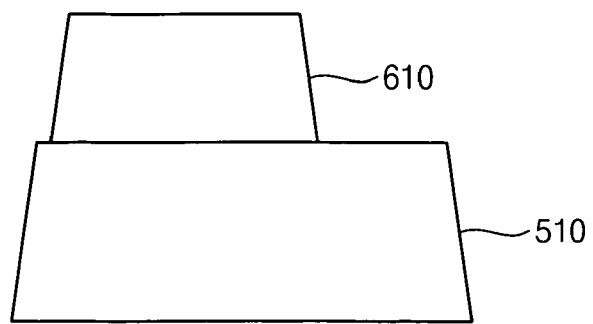

As shown in FIG. 6, a second lens pattern 610 is formed on the first lens pattern 510. The second lens pattern 610 may be made of the same materials as the first lens pattern 510. For example, thermosetting acrylic resin with a light-transmittance which is no less than about 95% may be used to form the second lens layer. The second lens pattern 610 may also be formed with photosensitive resins or thermoplastic materials. As described above, the second lens pattern 610 may be formed by an exposure and developing method. The second lens pattern 610 is formed on a portion of which a curvature is intended to be increased.

Figure 7:
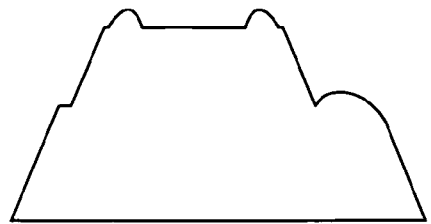
Figure 8:
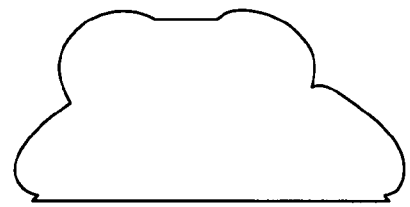
Figure 9:
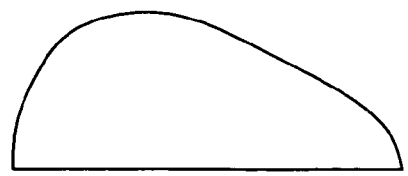

A change in shape of the first lens pattern 510 and the second lens pattern 610 of FIG. 6 in a reflowing process is illustrated in FIGS. 7 through 9.

For example, the first lens pattern and the second lens pattern may be heated sequentially at about 140° C. for about 5 minutes, at about 150° C. for about 5 minutes, at about 160° C. for about 5 minutes and at about 170° C. for about 5 minutes, and then cooled. The first lens pattern and the second lens, which are softened in the step of reflowing, come to be in a shape of a plano-convex lens through the influence of surface tension and viscosity. However, as a result of forming the second lens pattern only on the portion of the first lens pattern, the portion at which the second lens pattern is formed gives rise to a greater curvature. Consequently, the microlens of the present exemplary embodiment, as shown in FIG. 9, has an asymmetric curvature, unlike the conventional microlens shown in FIG. 1 which has a constant curvature.

FIGS. 10 through 15 are cross-sectional diagrams illustrating operations for controlling an asymmetric curvature of a microlens according to an exemplary embodiment of the present invention.

Figure 10:
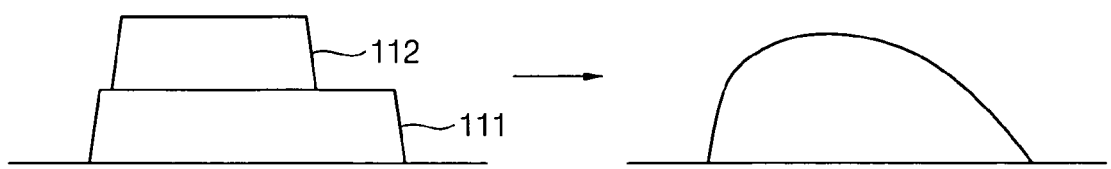
FIGS. 10 through 15 are cross-sectional diagrams illustrating operations for controlling an asymmetric curvature of a microlens according to an exemplary embodiment of the present invention.
Figure 11:
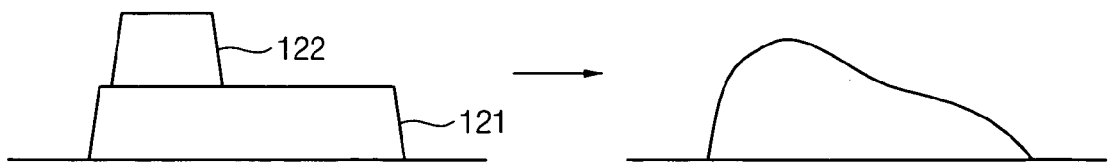

FIGS. 10 and 11 illustrate that the asymmetric curvature of the microlens may be controlled based upon an area of the second lens pattern, wherein the area of the second lens pattern refers to a contact area between the first lens pattern and the second lens pattern. A second lens pattern 112, which is distributed widely on a first lens pattern 111, may be formed and then reflowed as shown in FIG. 10, while a second lens pattern 122, which is distributed narrowly relative to the second lens pattern 112 of FIG. 10, may be formed on a first lens pattern 121, and then reflowed as shown in FIG. 11. It will be understood through FIG. 10 and FIG. 11 that the resulting curvatures are different from each other.

Figure 12:
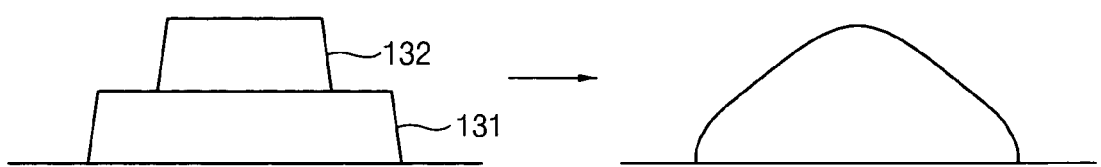
Figure 13:
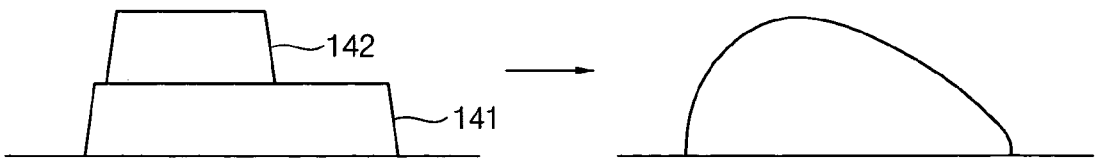

Furthermore, referring to FIG. 12 and FIG. 13, a position of the second lens pattern on the first lens pattern may be used in controlling the curvature of the microlens. A second lens pattern 132 may be formed on the center of a first lens pattern 131 and then reflowed as shown in FIG. 12, while a second lens pattern 142 may be formed on a portion deviated from the center of a first lens pattern 141 as shown in FIG. 13. It will be understood through FIG. 12 and FIG. 13 that the resulting curvatures are different from each other.

Figure 14:
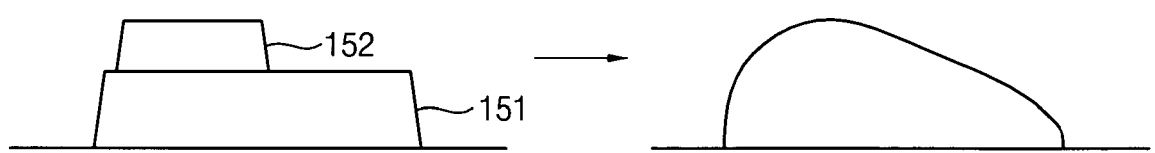
Figure 15:
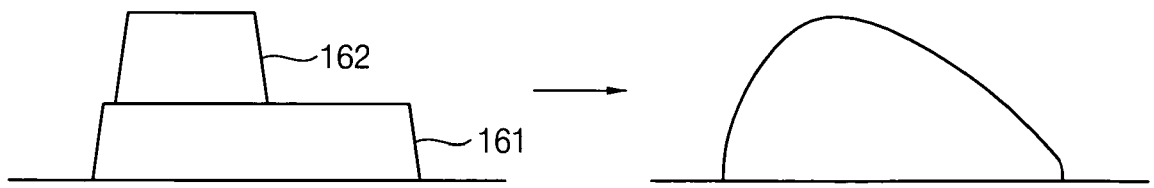

Moreover, as shown in FIG. 14 and FIG. 15, the thickness of the second lens pattern may be used in controlling the curvature of the microlens. A second lens pattern 152, which is relatively thin, may be formed on a first lens pattern 151 and then reflowed as shown in FIG. 14, while a second lens pattern 162, which is thicker than the second lens pattern 152 of FIG. 14, may be formed on a first lens pattern 161 as shown in FIG. 15. It will be understood that the resulting curvatures are different from each other.

As described above with respect to FIGS. 10 through 15, the curvature of the microlens may be controlled based on at least one factor such as area, position and thickness. In addition, a combination of at least two factors such as area, position and thickness may be used in controlling the curvature of the microlens.

In additional exemplary embodiments, more than two lens patterns may be formed on a first lens pattern, and then reflowed to control an asymmetric curvature of the microlens. For example, a third lens pattern may be formed on a second lens pattern after forming the second lens pattern on the first lens pattern. The first lens pattern, the second lens pattern and the third lens pattern may be reflowed together after formation of the three patterns are finished.

Figure 16:
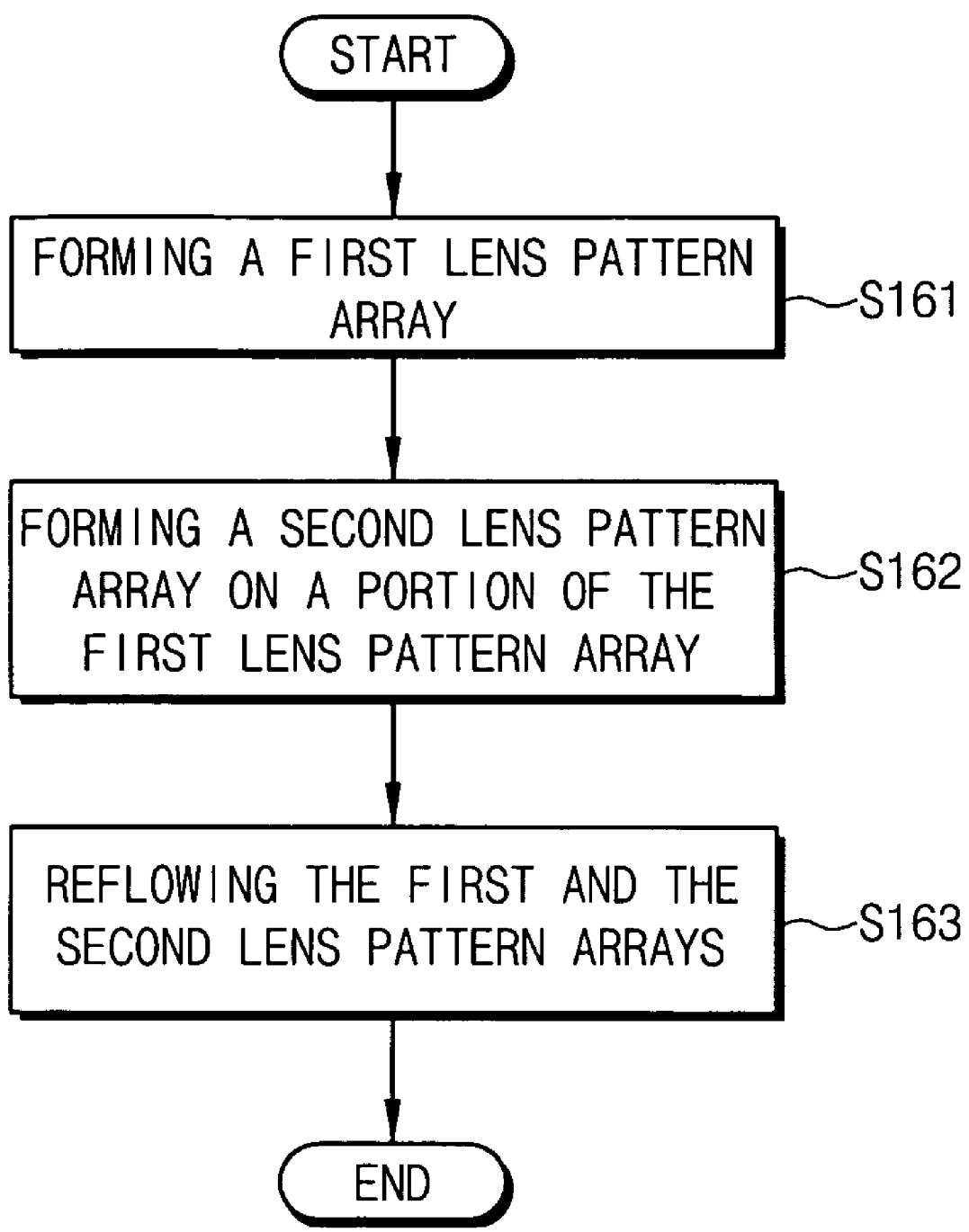
FIG. 16 is a flowchart illustrating operations for manufacturing a microlens array according to an exemplary embodiment of the present invention.

FIG. 16 is a flowchart illustrating a method for manufacturing a microlens array according to an exemplary embodiment of the present invention.

Referring to FIG. 16, in manufacturing a microlens array of the present exemplary embodiment, a first lens pattern array is formed in step S161. The first lens pattern array may be formed over a photo detector, wherein the photo detector includes devices, such as a photodiode, that receives light and converts the received light into an electric signal. A light-transmitting layer or a flattening layer may be formed between the first lens pattern array and the photo detector.

The first lens pattern array may be made of materials such as a thermosetting acrylic resin with a light-transmittance which is no less than about 95%. The first lens pattern array may also be formed with photosensitive resins or thermoplastic materials.

The first lens pattern array may be formed by an exposure and developing method or by a photolithography method using photoresist, as described above in the previous exemplary embodiments with respect to manufacturing a microlens.

In step S162, a second lens pattern array is formed on the first lens pattern array. Each of the microlenses of the microlens array which are farther from the center of the microlens array are provided with a higher asymmetry of curvature than the asymmetry of curvature provided for those microlenses located nearer the center of the microlens array.

The second lens pattern array may be made of the same materials as the first lens pattern array. For example, the second lens pattern array may be formed of a thermosetting acrylic resin with a light-transmittance which is no less than about 95%, photosensitive resins or thermoplastic materials.

The second lens pattern array may be formed by an exposure and developing method or by a photolithography method using a photoresist, as described above in the previous exemplary embodiments with respect to manufacturing a microlens.

For the purpose of forming an asymmetric curvature of a microlens, the second lens pattern array is formed only on the portion of the first lens pattern array.

An area of a second lens pattern of the second lens pattern array, a position of the second lens pattern of the second lens pattern array and a thickness of a second lens pattern of the second lens pattern array may be changed according to a position of the second lens pattern in the array. In other words, if the first lens pattern and the second lens pattern correspond to the microlens that is near the center of the microlens array, the second lens pattern is formed so that the corresponding microlens has a relatively lower asymmetry of curvature. On the contrary, if the first lens pattern and the second lens pattern correspond to the microlens that is far from the center of the microlens array, the second lens pattern is formed so that the corresponding microlens has a relatively higher asymmetry of curvature. As described above with respect to FIGS. 10 through 15, the curvature of the respective microlenses of the microlens array may be controlled based on the position, the area and the thickness of the corresponding second lens pattern of the second lens pattern array.

In step S163, the first lens pattern array and the second lens pattern array, which were formed so as to control the asymmetric curvature, are then reflowed. The microlenses of the microlens array produced by reflowing process which are located far from the center of the microlens array have a higher asymmetry of curvature than the asymmetry of curvature for those microlenses formed nearer the center of the microlens array.

Typically, the center of the microlens array corresponds to a spot on which light is incident at a right angle with respect to a light-receiving plane. In addition, the center of the microlens array may correspond to the center of a module lens. The incident angle of the light through the module lens becomes skewed against the light-receiving plane because the position of incidence is far from the center of the microlens array. The skewed incidence angle may be compensated by the asymmetric curvature of the microlens, which is changed based on the location of the microlens with respect to the center of the microlens array.

In the step of reflowing, the first lens pattern array and the second lens pattern array may be heated at a gradually increasing temperature, and then may be cooled. For example, the first lens pattern array and the second lens pattern array may be heated sequentially at about 140° C. for about 5 minutes, at about 150° C. for about 5 minutes, at about 160° C. for about 5 minutes and at about 170° C. for about 5 minutes, and then cooled.

The first lens pattern and the second lens pattern of the array, which are softened during the step of reflowing, come to be in the shape of a plano-convex lens through the influence of surface tension and viscosity. However, as a result of forming the second lens pattern only on the portion of the first lens pattern, the portion at which the second lens pattern is formed gives rise to a greater curvature. Consequently, the microlens of the present exemplary embodiment has an asymmetric curvature unlike the conventional microlens shown in FIG. 1 having a constant curvature.

Figure 17:
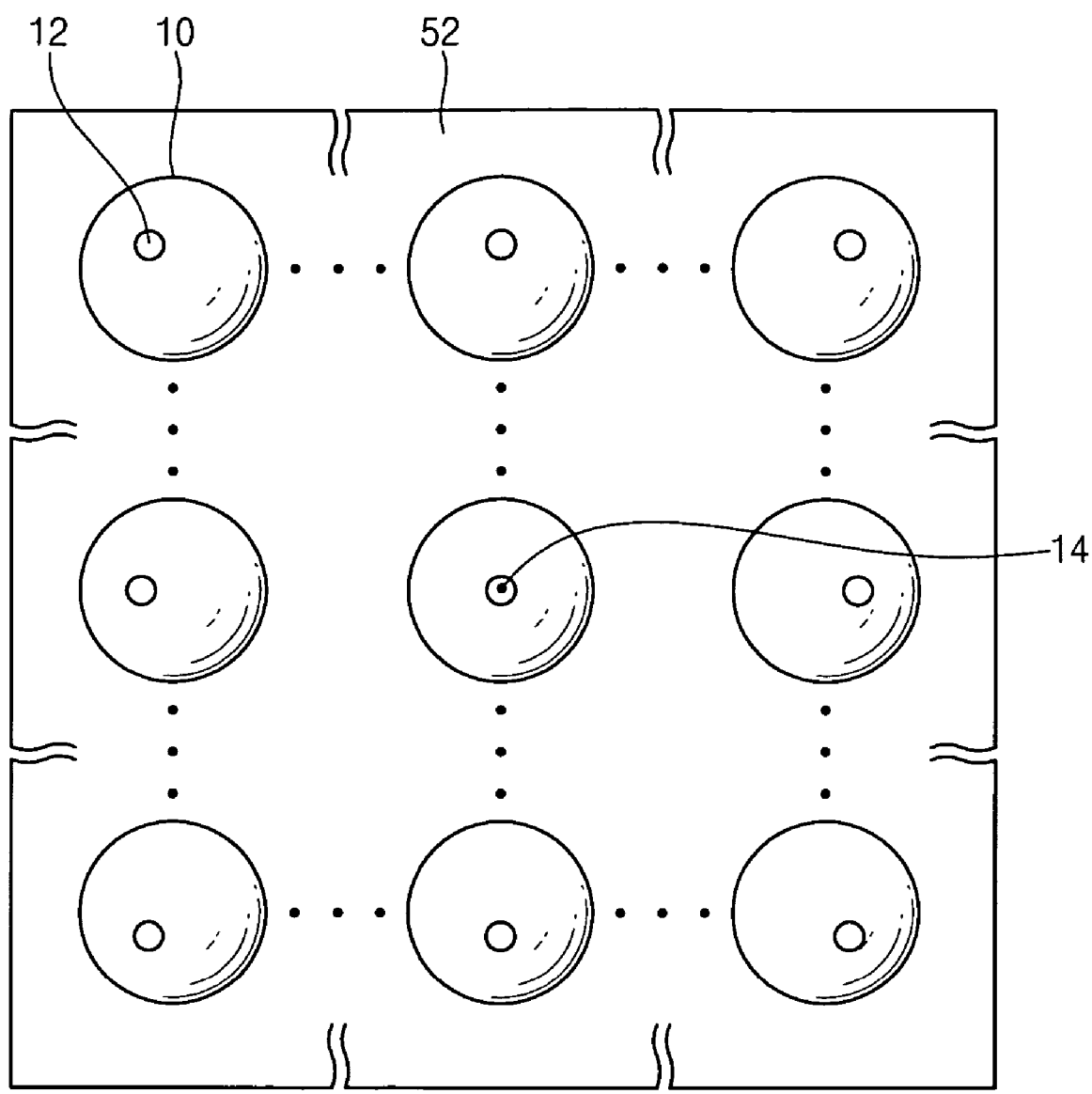
FIG. 17 is a top plan view of a microlens array according to an exemplary embodiment of the present invention, seen from the direction of incidence.

FIG. 17 is a top plan view of a microlens array according to an exemplary embodiment of the present invention, which is seen from a direction of incidence.

As shown in FIG. 17, the microlens array may have a plurality of microlenses 10. A module lens is placed over the microlens array. Light is incident on the microlens array through the module lens.

In the microlens array, there exists both near microlens and distant microlens defined by the distance between the microlens and the center 14 of the microlens array. An uppermost portion 12 of a curved surface of each microlens is indicated in FIG. 17. The uppermost portion 12 of the microlens surface is a spot where respective microlenses first make contact with a plane parallel to the light-receiving plane 52 if the plane approaches the microlens array from the incidence direction. As illustrated in FIG. 17, the more distant the microlens is from the center of the microlens array, the further apart the uppermost portion 12 of the microlens is from the center of the microlens. The uppermost portion 12 of the microlens is located outward from the center 14 of the microlens array. Because the deviation of the length of the uppermost portion of the microlens from the center of the respective microlens corresponds to the extent of the asymmetry of curvature of the microlens, the microlens has a higher asymmetry when the distance of the microlens from the center 14 of the microlens array is greater. In this way, the light-receiving rate of the microlens distant from the center of the microlens array is enhanced by causing asymmetric curvatures of the microlenses in the microlens array.

Figure 18:
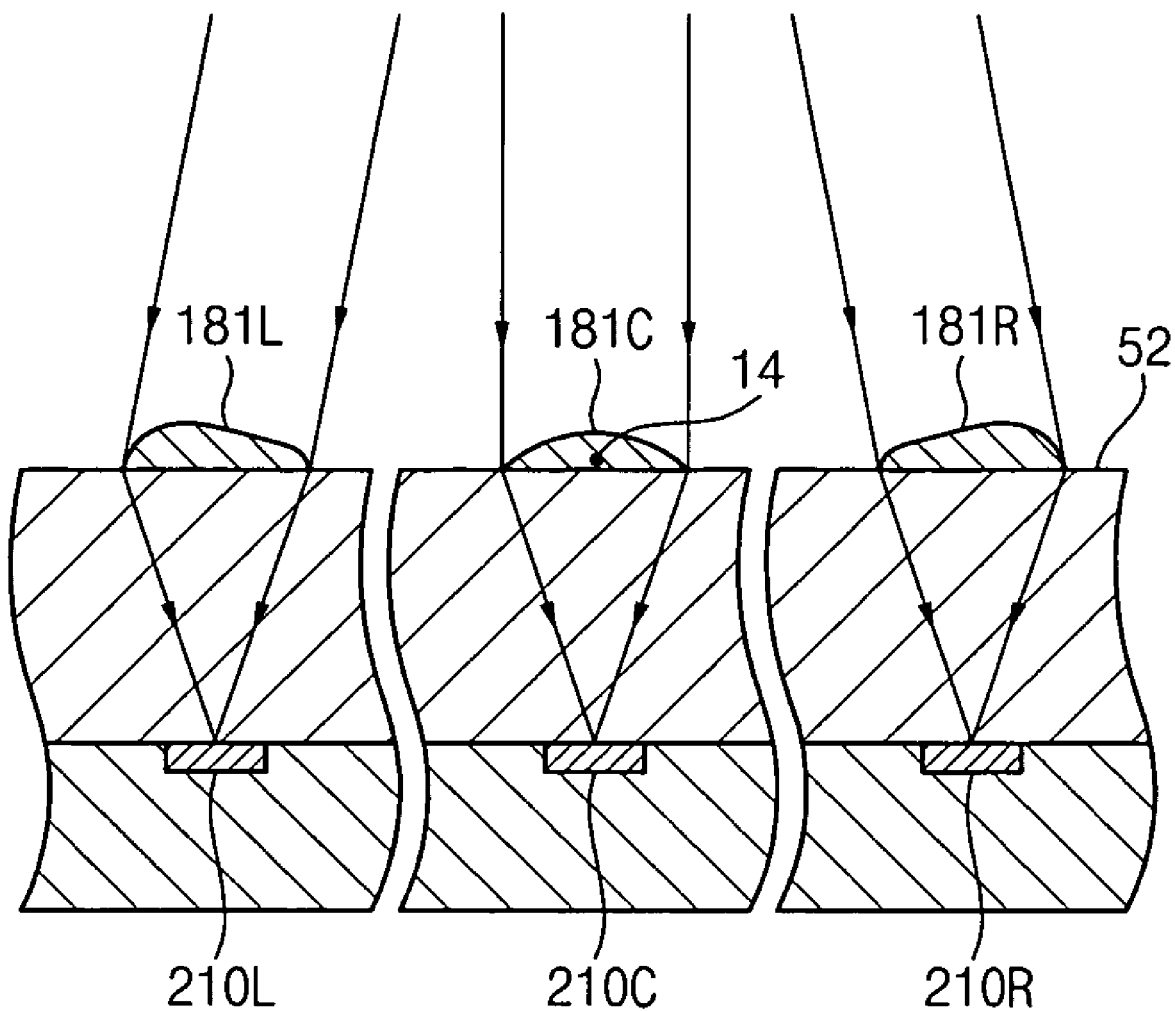
FIG. 18 is a cross-sectional diagram illustrating an image sensor showing an improved shading phenomenon.

FIG. 18 is a cross-sectional diagram illustrating an image sensor according to an exemplary embodiment of the present invention showing an improved shading phenomenon.

Referring to FIG. 18, each of microlenses 181L, 181C and 181R is placed over respective photo detectors 210L, 210C and 210R. As shown in FIG. 18, the light through the module lens is incident on the microlens 181C at the center 14 of the microlens array from a direction perpendicular to the light-receiving plane 52, while incident on the microlenses 181L and 182R at outskirts of the microlens array from a direction tilted from the right angle.

The curvatures of the microlenses 181L and 181R located far from the center 14 of the microlens array are asymmetric, unlike the microlens 181 having a constant curvature. In other words, for the respective microlenses 181L and 181R, curvature of a farther portion from the center 14 of the microlens array is greater than that of a nearer portion.

Therefore, the image sensor of FIG. 18 concentrates the light effectively on the center of the respective photodiodes 210L and 210R, even though the corresponding microlenses are apart from the center 14 of the microlens array. The light-receiving rate of the photodiode is enhanced through decreasing the light that is intercepted by the lightproof film and increasing the surface area of the microlens that skewed light can reach.

FIGS. 19 through 29 are cross-sectional diagrams illustrating operations for manufacturing a CMOS image sensor according to an exemplary embodiment of the present invention.

Figure 19:
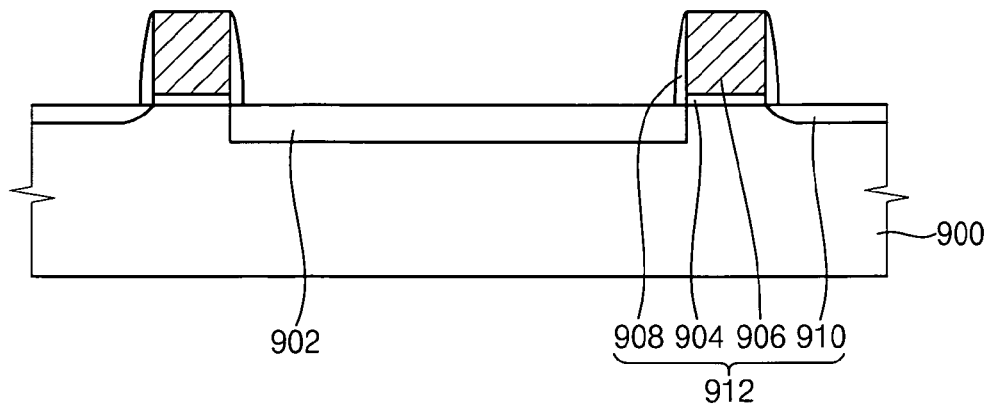
FIGS. 19 through 29 are cross-sectional diagrams illustrating operations for manufacturing a CMOS image sensor according to an exemplary embodiment of the present invention.

Referring to FIG. 19, a field oxide film defining an active region and a field region is formed on a substrate 900. A photo detector 902 such as a photodiode is formed on a surface of the active region. In addition, a transistor 912, which is connected to the photo detector 902, is formed on the substrate 900. The transistor 912 functions as a switching element of the photo detector 902. More specifically, a gate-insulating film 904 is formed on a semiconductor substrate 900, and then a gate electrode 906 is formed on the gate-insulating film 904. Next, a source/drain region 910 is formed on the surface of the semiconductor substrate 900 between the gate electrodes 906 by injecting impurities into the surface. The spacers 908 are formed on both side walls of the gate electrode 906, and then the transistor 912 comprising the gate insulating film 904, the gate electrode 906, the source/drain region 910 and spacers 908 are completed.

Figure 20:
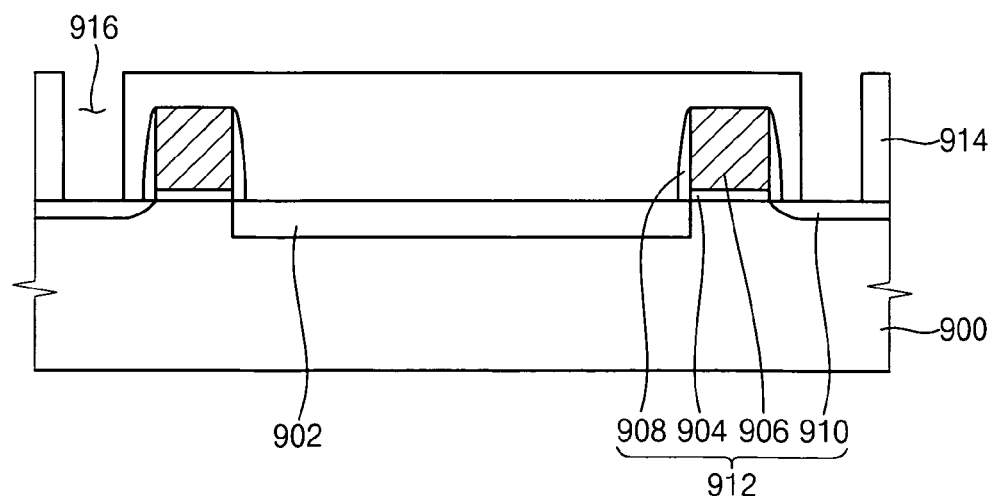

Referring to FIG. 20, an insulating film 914 is formed so as to cover the semiconductor substrate 900, which includes the transistor 912 formed as above. The insulating film 914 may be formed using transparent materials such as, for example, silicon oxide. By carrying out an exposure and development process with the insulating film 914, a first contact hole 916 is formed, which exposes a predetermined portion of the transistor 912.

Figure 21:
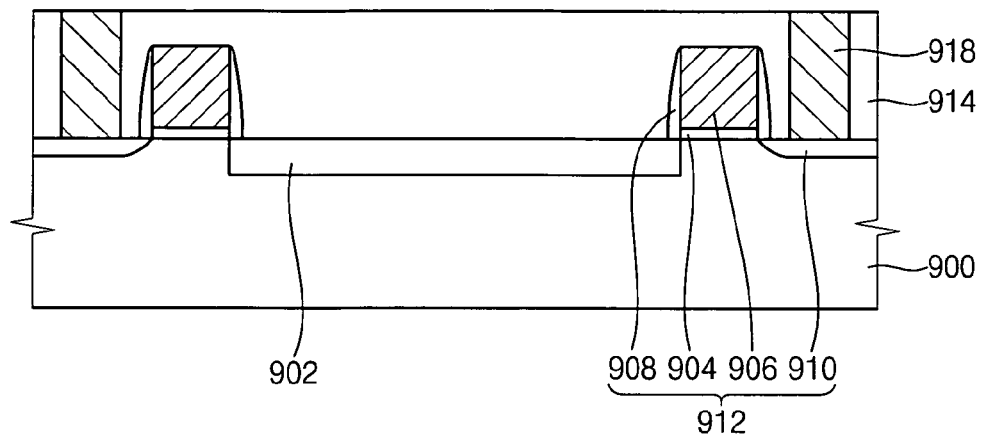

Referring to FIG. 21, a first metal layer is formed, which fills in the first contact hole 916. The first metal layer may include but is not limited to metals such as titanium, tungsten, and copper. The first metal layer may be formed by using chemical vapor deposition (CVD) or a sputtering method. Subsequently, the first metal layer including the above metals is polished by chemical mechanical polishing (CMP) until the surface of the insulating film 914 is exposed, thereby forming a first metal pad 918 that fills in the first contact hole 916.

Figure 22:
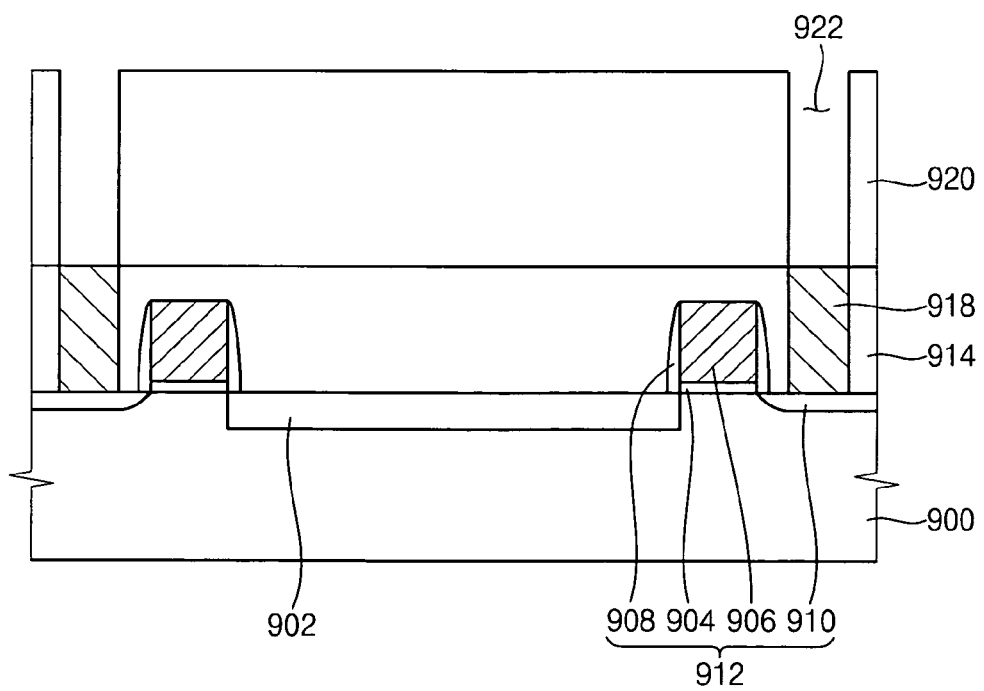

An interlayer insulating film 920 is formed on the insulating film 914 and the first metal pad 918 as shown in FIG. 22. The interlayer insulating film 920 may be formed using transparent materials. Next, a second contact hole 922 exposing the first metal pad is formed by removing the interlayer insulating film 920 by using a typical photo etching.

Figure 23:
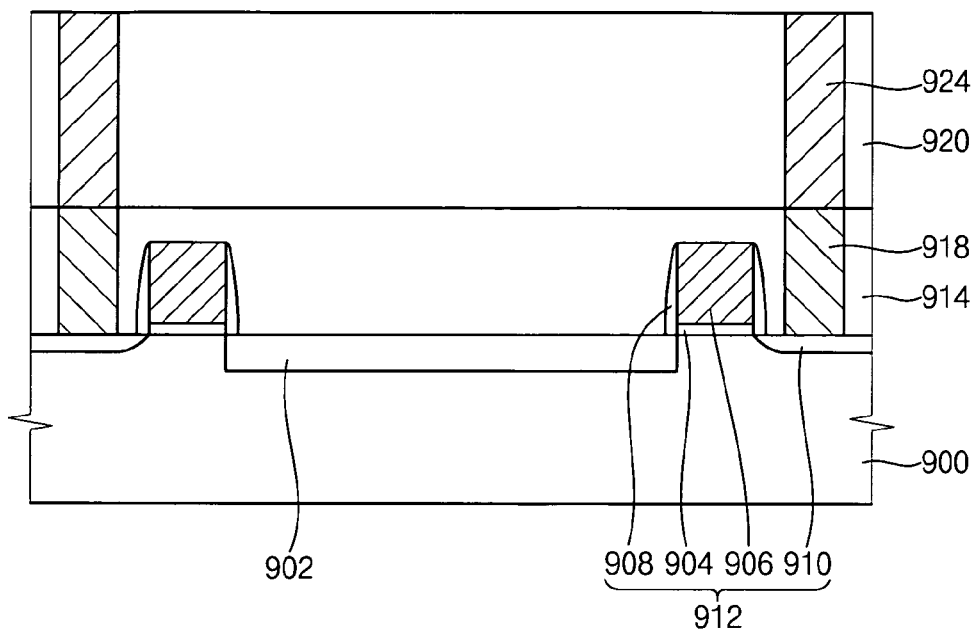

Referring to FIG. 23, a second metal layer which fills in the second contact hole 922 is formed. The second metal layer may be formed by using chemical vapor deposition or the sputtering method and may include but is not limited to metals such as titanium, tungsten, and copper. Subsequently, the second metal layer is polished by chemical mechanical polishing until the surface of the interlayer insulating film 920 is exposed, thereby forming a second metal pad 924 that fills in the second contact hole 922. As a result, an interlayer insulating film structure including the interlayer insulating film 920 and the second metal pad 924 is completed.

Figure 24:
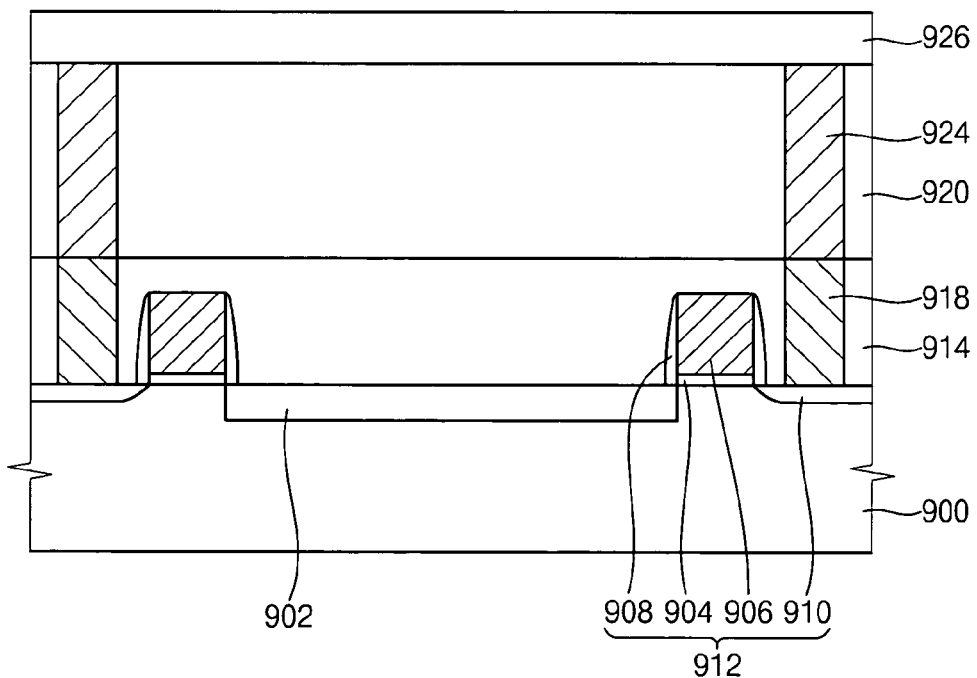

As shown in FIG. 24, a first photosensitive film 926 is formed on the interlayer insulating film 920 and the second metal pad 924. The first photosensitive film 926 plays a role in protecting elements from moisture and scratches. The first photosensitive film 926 may include photosensitive material such as photoresist.

Figure 25:
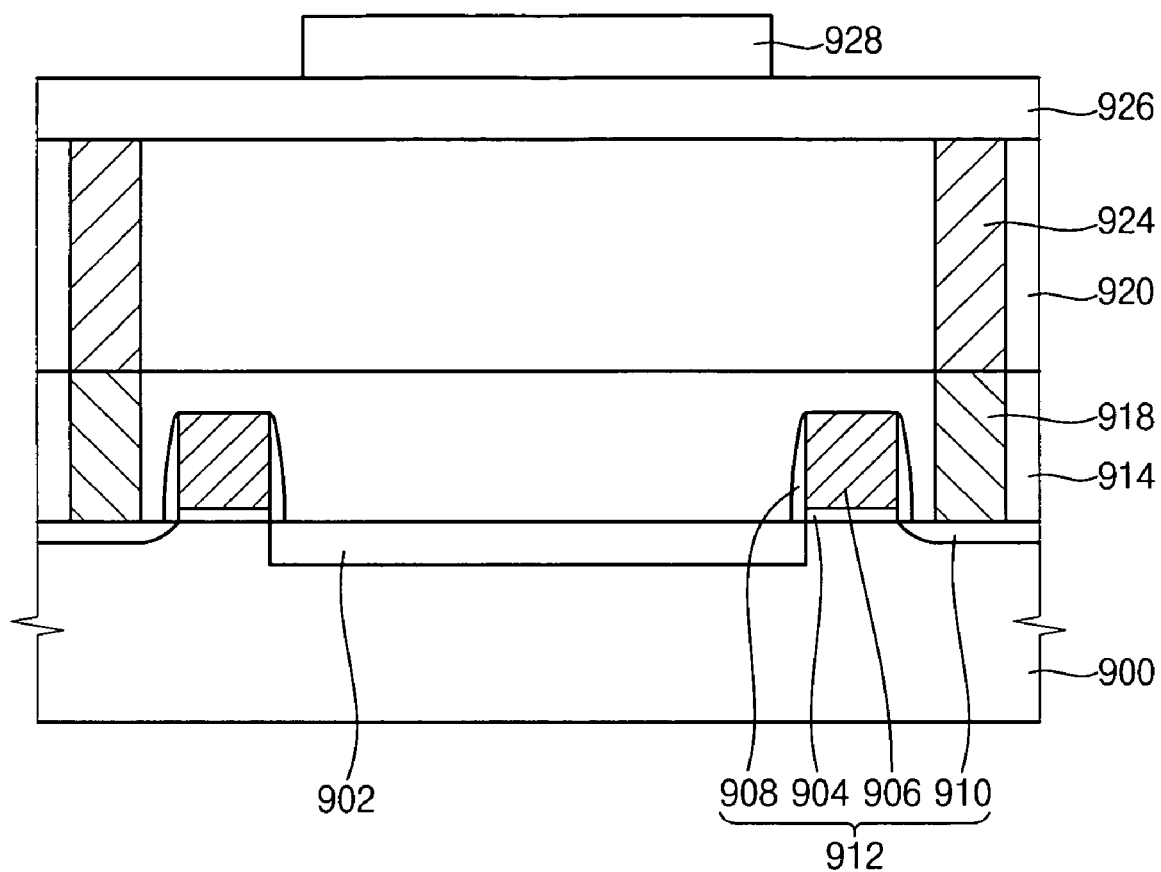

Next, as shown in FIG. 25, a color filter 928, which has an array configuration of blue, green and red color filters, may be formed over the first photosensitive film 926. One of blue, green and red filters may be formed over a photodiode as a light-receiving element illustrated in FIG. 25. The color filter 928 may include photosensitive material such as a photoresist. The photosensitive material used for the color filter 928 may include but is not limited to, for example, methacrylic resins, and cross-linked methacrylic resins.

Figure 26:
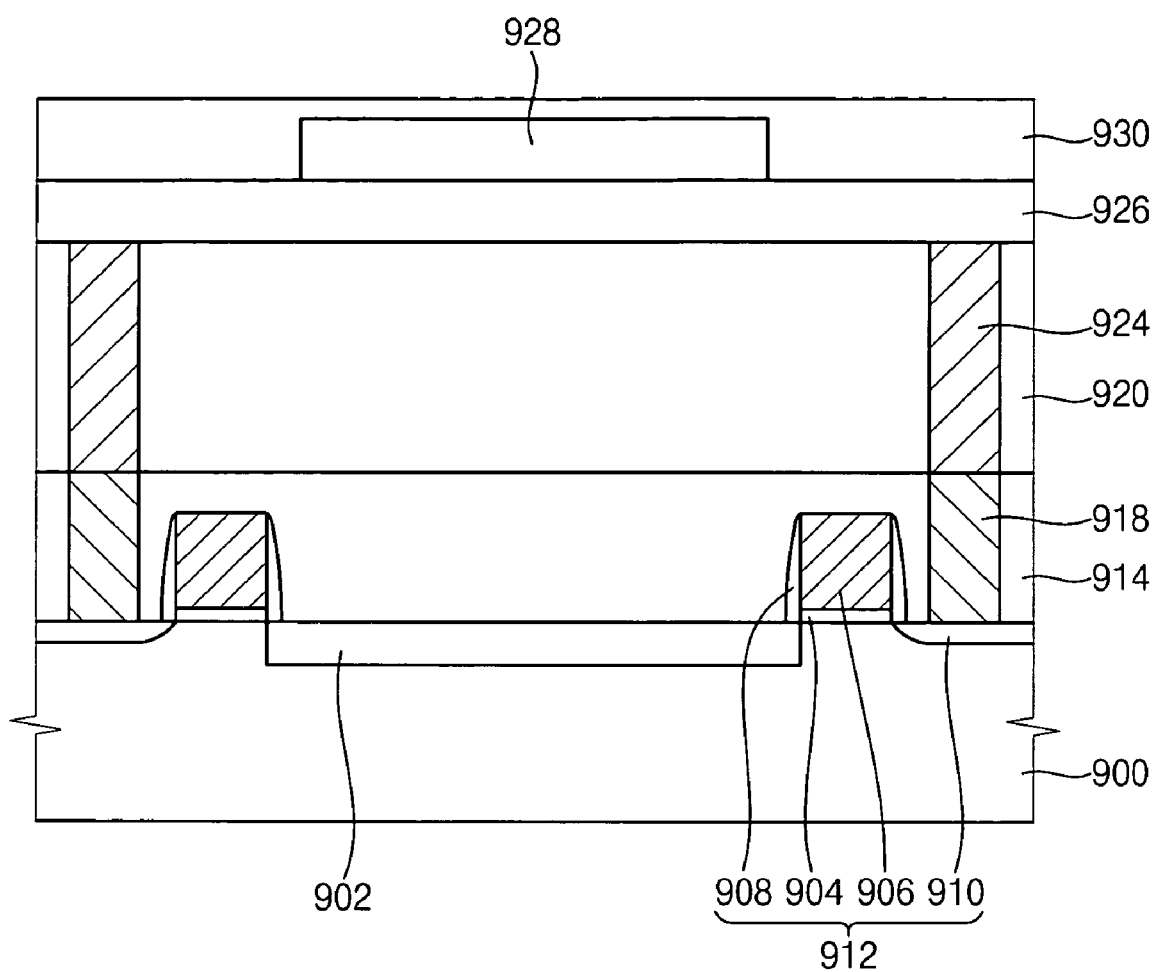

Referring to FIG. 26, a second photosensitive film 930 is formed on the first photosensitive film 926 and the color filter 928. Typically, a color filter is formed so that it might have a step, which should be removed to provide a flattened surface on which a microlens is formed by subsequent processes. The second photosensitive film 930 has a role in removing the step caused by the color filter 928. The second photosensitive film 930 may include photosensitive material such as a photoresist, and the included photoresist in the second photosensitive film 930 may be the same as or different from that in the first photosensitive film 926.

Figure 27:
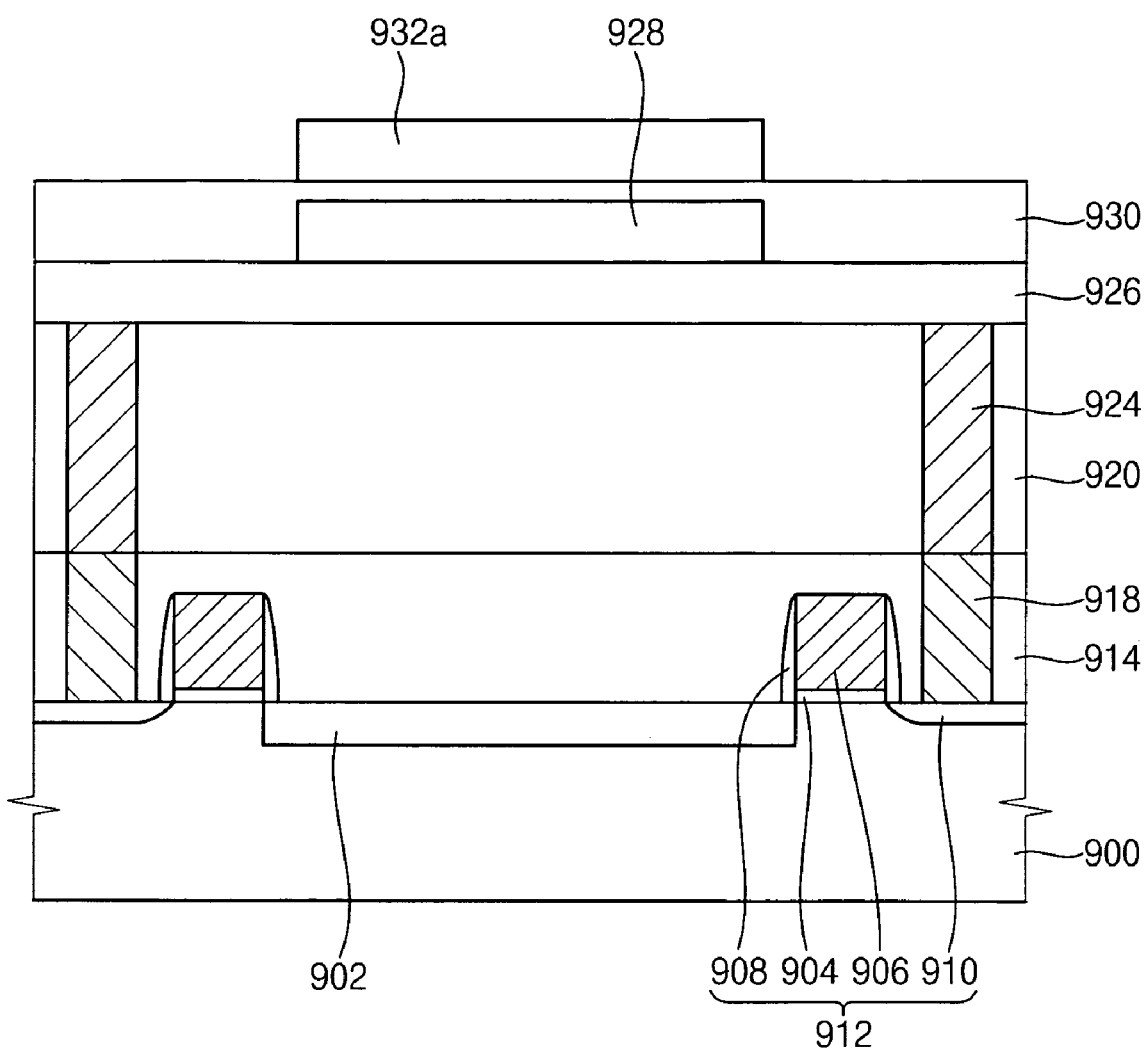

Now, referring to FIG. 27, a first lens pattern 932*a* is formed on the color filter 928. The first lens pattern is formed over the photodiode 902, and may be made of materials such as a thermosetting acrylic resin with a light-transmittance which is no less than about 95% or may be formed with photosensitive resins or thermoplastic materials. The first lens pattern may be formed by an exposure and developing method or by a photolithography method using a photoresist.

Figure 28:
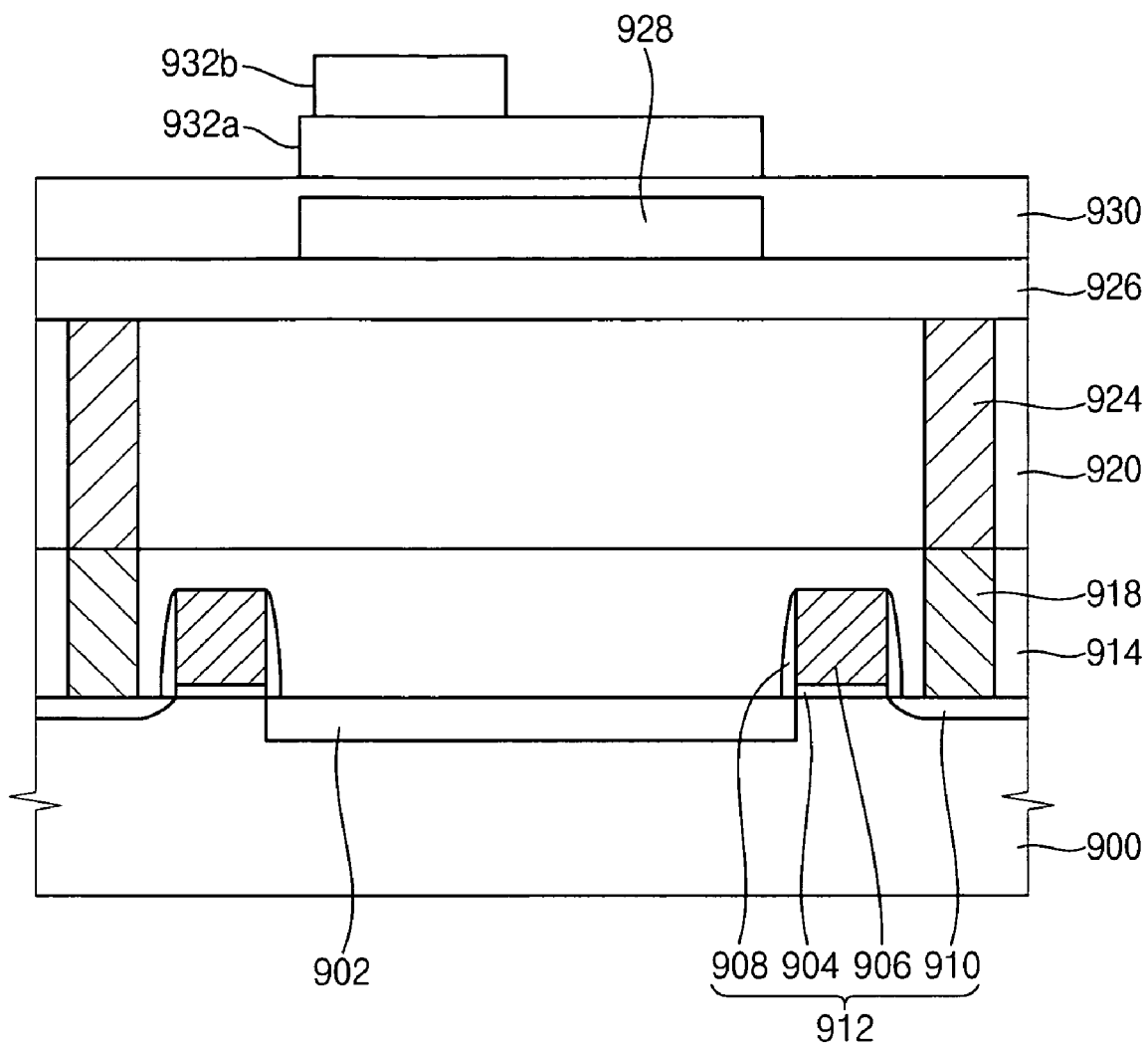

Referring to FIG. 28, a second lens pattern 932*b* is formed on a portion of the first lens pattern. The second lens pattern 932*b* may be made of the same materials as the first lens pattern 932*a*. The second lens pattern 932*b* may also be formed by an exposure and developing method or by a photolithography method using photoresist.

In an image sensor including a microlens array of a plurality of microlenses, the area of the second lens pattern 932*b* of a second lens pattern array, position of the second lens pattern 932*b* of the second lens pattern array and/or the thickness of the second lens pattern 932*b* of the second lens pattern array may be changed according to a location of the second lens pattern 932*b* in the array. In other words, if the first lens pattern 932*a* and the second lens pattern 932*b* correspond to a microlens that is located near the center of the microlens array, the second lens pattern is formed so that the corresponding microlens has a relatively lower asymmetry. On the contrary, if the first lens pattern 932*a* and the second lens pattern 932*b* correspond to the microlens that is far from the center of the microlens array, the second lens pattern is formed so that the corresponding microlens has a relatively higher asymmetry. As described above with reference to FIGS. 10 through 15, the curvature of the respective microlenses in the array may be controlled based on the position, the area and/or the thickness of the corresponding second lens pattern of the second lens pattern array.

Figure 29:
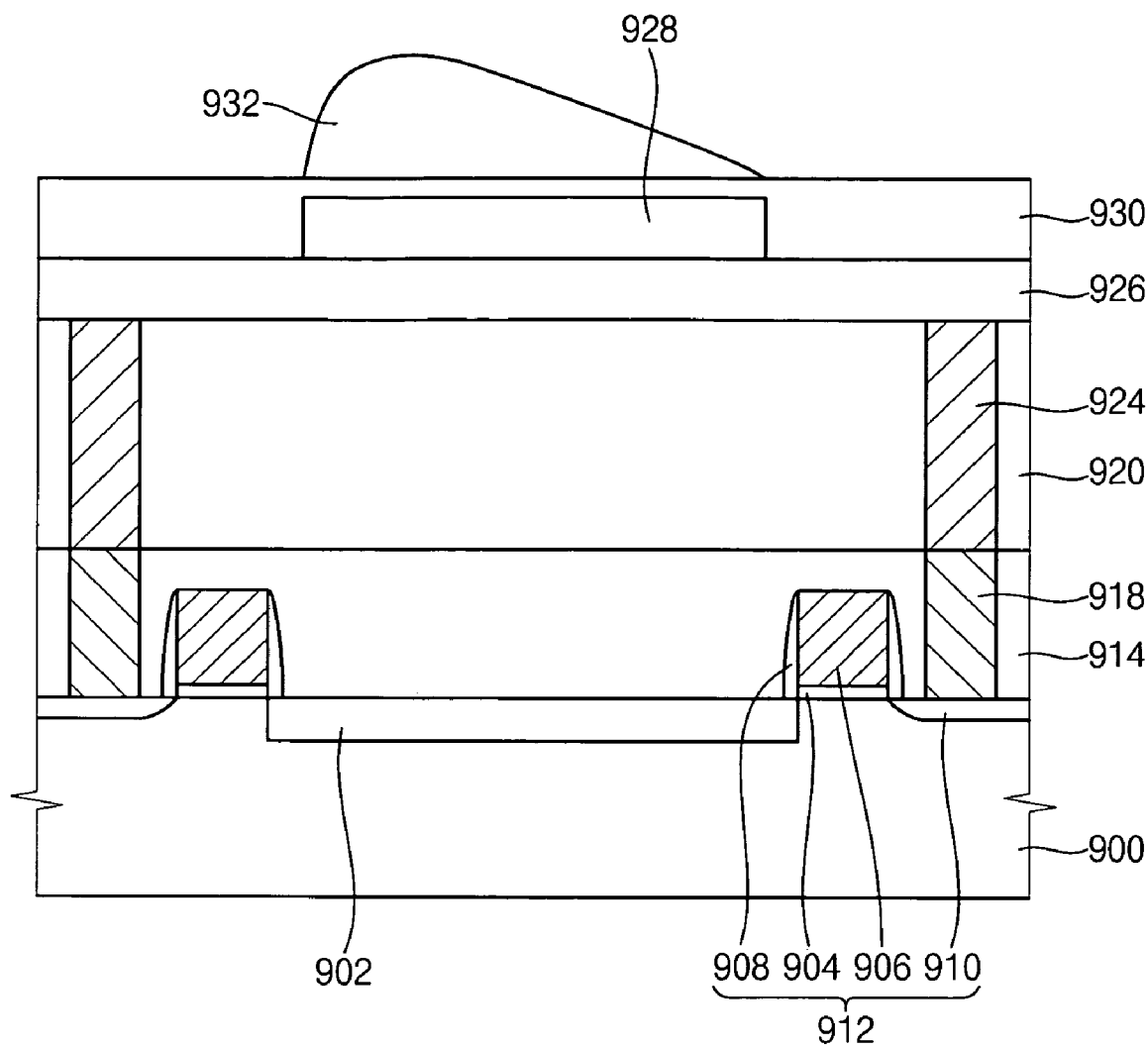

Referring to FIG. 29, the first lens pattern 932*a* and the second lens pattern 932*b*, which are formed so as to control an asymmetric curvature, are reflowed. As described above, when the distance between the microlens 932 and the center of the microlens array increases the asymmetric curvature of the microlens 932 is increased as well. In the step of reflowing, the first lens pattern 932*a* and the second lens pattern 932*b* may be heated at a gradually increasing temperature, and then may be cooled. For example, the first lens pattern and the second lens pattern may be heated sequentially at about 140° C. for about 5 minutes, at about 150° C. for about 5 minutes, at about 160° C. for about 5 minutes and at about 170° C. for about 5 minutes, and then cooled.

The first lens pattern 932*a* and the second lens pattern 932*b*, which are softened in the step of reflowing, come to be in the shape of a plano-convex lens through the influence of surface tension and viscosity. However, as a result of forming the second lens pattern only on the portion of the first lens pattern, the portion at which the second lens pattern is formed gives rise to a greater curvature. By additional typical processes, the CMOS image sensor is finished.

Through FIGS. 19 through 29, the methods of manufacturing a CMOS image sensor have been described. The present invention, however, should not be construed as limited to a manufacturing process of the CMOS image sensor. Rather, other image sensors known in the art including but not limited to charge-coupled device (CCD) image sensors may also be used in accordance with the exemplary embodiments of the present invention.

According to various exemplary embodiments of the present invention, methods of manufacturing microlenses, microlens arrays and image sensors, where a curvature of a microlens is asymmetric and the asymmetric curvature is controlled with efficiency, are provided. Even a microlens remote from the center of a microlens array may focus incident light on a photo detector regardless of a microlens size. A shading phenomenon is also diminished by increasing the surface area of the microlens where incident light can reach.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a microlens, comprising:
   forming a first lens pattern;
   forming a second lens pattern on a portion of the first lens pattern; and
   reflowing the first and second lens patterns in a manner which controls an asymmetric curvature of the microlens,
   wherein the reflowing of the first and second lens patterns comprises:
      heating the first and second lens patterns sequentially at about 140° C., at about 150° C., at about 160° C. and at about 170° C. respectively for about 5 minutes; and
      cooling the first and second lens patterns.

2. The method of claim 1, wherein the microlens is used in a complementary metal-oxide semiconductor (CMOS) image sensor.

3. The method of claim 1, wherein the microlens is used in a charge-coupled device (CCD) image sensor.

4. The method of claim 1, wherein the asymmetric curvature of the microlens is controlled based on an area of the second lens pattern making contact with the first lens pattern.

5. The method of claim 1, wherein the asymmetric curvature of the microlens is controlled based on a position of the second lens pattern on the first lens pattern.

6. The method of claim 1, wherein the asymmetric curvature of the microlens is controlled based on a thickness of the second lens pattern.

7. The method of claim 1, further comprising forming a third lens pattern on the second lens pattern,
   wherein the third lens pattern is reflowed together with the first and second lens patterns after the third lens pattern is formed in a manner which controls the asymmetric curvature of the microlens.

8. The method of claim 1, wherein the reflowing of the first and second lens patterns comprises:
   heating the first and second lens patterns while a heating temperature is gradually increased; and
   cooling the first and second lens patterns.

9. The method of claim 1, wherein the first and second lens patterns comprise a thermosetting acrylic resin having a light-transmittance which is no less than about 95%.

10. A method of manufacturing a microlens array having a plurality of microlenses, comprising:
    forming a first lens pattern array;
    forming a second lens pattern array on the first lens pattern array in a manner which controls an asymmetric curvature of each of the plurality of microlenses of the microlens array such that a microlens of the plurality of microlenses which is located farther from the center of the microlens array has a higher asymmetry of curvature than another microlens of the plurality of microlenses which is located nearer to the center of the microlens array, and such that a most convex portion of each microlens of the plurality of microlenses becomes farther from a center of the corresponding microlens according to a distance between the portion of the microlens of the plurality of microlenses and the center of the microlens array; and
    reflowing the first and second lens pattern arrays.

11. The method of claim 10, wherein the microlens array is used in a complementary metal-oxide semiconductor (CMOS) image sensor.

12. The method of claim 10, wherein the microlens array is used in a charge-coupled device (CCD) image sensor.

13. The method of claim 10, wherein the asymmetric curvature of the plurality of microlenses of the microlens array arc controlled based on an area of a second lens pattern of the second lens pattern array making contact with a first lens pattern of the first lens pattern array.

14. The method of claim 10, wherein the asymmetric curvature of the plurality of microlenses of the microlens array are controlled based on a position of a second lens pattern of the second lens pattern array on a first lens pattern of the first lens pattern array.

15. The method of claim 10, wherein the asymmetric curvature of the microlenses of the microlens array is controlled based on a thickness of a second lens pattern of the second lens pattern array.

16. The method of claim 10, further comprising forming a third lens pattern array on the second lens pattern array.

17. The method of claim 10, wherein the reflowing of the first and second lens pattern arrays comprises:
    heating the first and second lens pattern arrays while a heating temperature is gradually increased; and
    cooling the first and second lens pattern arrays.

18. The method of claim 10, wherein the first and second lens pattern arrays comprise a thermosetting acrylic resin having a light-transmittance which is no less than about 95%.

19. The method of claim 18, wherein the first and second lens pattern arrays are heated sequentially at about 140° C., at about 150° C., at about 160° C. and at about 170° C. respectively for about 5 minutes, and then cooled.

20. A method of manufacturing an image sensor including a microlens array having a plurality of microlenses, the method comprising:
    forming a photo detector array on a semiconductor substrate;
    forming a first lens pattern array over the photo detector array;
    forming a second lens pattern array on the first lens pattern array; and
    reflowing the first and second lens pattern arrays in a manner which controls an asymmetric curvature of each of the plurality of microlenses of the microlens array, wherein a microlens of the plurality of microlenses which is located farther from the center of the microlens array has a higher asymmetry of curvature than another microlens of the plurality of microlenses located nearer to the center of the microlens array, and wherein a most convex portion of each microlens of the plurality of microlenses becomes farther from a center of the corresponding microlens according to a distance between the portion of the microlens of the plurality of microlenses and the center of the microlens array.

21. The method of claim 20, wherein the manufacturing method is used for manufacturing a complementary metal-oxide semiconductor (CMOS) image sensor.

22. The method of claim 20, wherein the manufacturing method is used for manufacturing a charge-coupled device (CCD) image sensor.

23. The method of claim 20, further comprising forming a color filter between the photo detector array and the first lens pattern array.

24. The method of claim 20, wherein the asymmetric curvature of the plurality of microlenses of the microlens array is controlled based on an area of a second lens pattern of the second lens pattern array making contact with a first lens pattern of the first lens pattern array.

25. The method of claim 20, wherein the asymmetric curvature of the plurality of microlenses of the microlens array is controlled based on a position of a second lens pattern of the second lens pattern array on a first lens pattern of the first lens pattern array.

26. The method of claim 20, wherein the asymmetric curvature of the plurality of microlenses of the microlens array is controlled based on a thickness of a second lens pattern of the second lens pattern array.

27. The method of claim 20, further comprising forming a third lens pattern array on the second lens pattern array,
wherein the third lens pattern array is reflowed together with the first and second lens pattern arrays after the third lens pattern array is formed.

28. The method of claim 20, wherein the reflowing of the first and second lens pattern arrays comprises:
heating the first and second lens pattern arrays while a heating temperature is gradually increased; and
cooling the first and second lens pattern arrays.

29. The method of claim 20, wherein the first and second lens pattern arrays comprise a thermosetting acrylic resin having a light-transmittance which is no less than about 95%.

30. The method of claim 29, wherein the reflowing of the first and second lens pattern arrays comprises;
heating the first and second lens pattern arrays sequentially at about 140° C., at about 150° C., at about 160° C. and at about 170° C. respectively for about 5 minutes; and
cooling the first and second lens pattern arrays.

31. The method of claim 4, wherein the asymmetric curvature of the microlens is controlled based on a position of the second lens pattern on the first lens pattern.

32. The method of claim 13, wherein the asymmetric curvature of the plurality of microlenses of the microlens array are controlled based on a position of a second lens pattern of the second lens pattern array on a first lens pattern of the first lens pattern array.

33. The method of claim 24, wherein the asymmetric curvature of the plurality of microlenses of the microlens array is controlled based on a position of a second lens pattern of the second lens pattern array on a first lens pattern of the first lens pattern array.

* * * * *